United States Patent
Wong et al.

(10) Patent No.: US 10,772,206 B2
(45) Date of Patent: Sep. 8, 2020

(54) BOARD TO BOARD INTERCONNECT

(71) Applicant: Intel Corporation, Santa Clara, CA (US)

(72) Inventors: Chee Ling Wong, Sungai Ara (MY); Wil Choon Song, Bayan Lepas (MY); Khang Choong Yong, Puchong (MY); Eng Huat Goh, Ayer Itam (MY); Mohd Muhaiyiddin Bin Abdullah, Kepala Batas (MY); Tin Poay Chuah, Bayan Baru (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/513,004

(22) Filed: Jul. 16, 2019

(65) Prior Publication Data
US 2019/0342996 A1 Nov. 7, 2019

Related U.S. Application Data

(63) Continuation of application No. 14/757,984, filed on Dec. 26, 2015, now Pat. No. 10,356,902.

(51) Int. Cl.
*H05K 1/11* (2006.01)
*H05K 1/14* (2006.01)
*H05K 1/02* (2006.01)

(52) U.S. Cl.
CPC ............ *H05K 1/117* (2013.01); *H05K 1/142* (2013.01); *H05K 1/0298* (2013.01); *H05K 2201/09845* (2013.01)

(58) Field of Classification Search
CPC ........ H05K 1/141; H05K 1/142; H05K 1/111; H05K 1/0298; H05K 3/368; H05K 3/469
See application file for complete search history.

(56) References Cited

U.S. PATENT DOCUMENTS

| | | | |
|---|---|---|---|
| 6,720,787 B2 * | 4/2004 | Kimura | H01R 13/2414 29/884 |
| 6,926,561 B1 * | 8/2005 | Handforth | H05K 1/117 439/632 |
| 6,966,784 B2 * | 11/2005 | Van Schuylenbergh | H01R 12/78 361/261 |
| 10,356,902 B2 * | 7/2019 | Wong | H05K 1/117 |
| 2013/0271924 A1 * | 10/2013 | Shen | H05K 1/181 361/728 |
| 2014/0069696 A1 * | 3/2014 | Rothkopf | H05K 1/118 174/254 |

\* cited by examiner

*Primary Examiner* — Nathan Milakovich
(74) *Attorney, Agent, or Firm* — Hanley, Flight & Zimmerman, LLC

(57) ABSTRACT

A system for board-to-board interconnect is described herein. The system includes a first printed circuit board (PCB) having a first recess along a first edge of the first PCB that exposes a first solder pad on a layer of the first PCB. The system also includes a second PCB having a second recess along a second edge of the second PCB that exposes a second solder pad on a layer of the second PCB. The second recess is complementary to the first recess to allow the first PCB to mate with the second PCB. The first solder pad is aligned with the second solder pad when the first PCB is mated with the second PCB. The system additionally includes an assembly configured to electronically couple the first solder pad with the second solder pad.

4 Claims, 9 Drawing Sheets

102

300

500

BOARD TO BOARD INTERCONNECT

CROSS REFERENCE TO RELATED APPLICATION

This is a Continuation of U.S. patent application Ser. No. 14/757,984 filed Dec. 26, 2015, the contents of which are fully incorporated herein.

TECHNICAL FIELD

This disclosure relates generally to interconnects. Specifically, this disclosure relates to board to board interconnects.

BACKGROUND

Printed circuit boards (PCBs) typically include solder at various layers to interconnect with other PCBs. However, the connector that is used to interconnect PCBs is usually placed on top of the PCBs. Unfortunately, this adds height to the layered PCBs, which increases the size of the devices that the PCBs are placed in. These include smart devices, such as phones, tablets, watches and other wearable computing devices, and system in package devices. A System in Package is a single module that encloses a number of integrated circuits, and may be used in small form computing devices.

BRIEF DESCRIPTION OF THE DRAWINGS

In some cases, the same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1A:
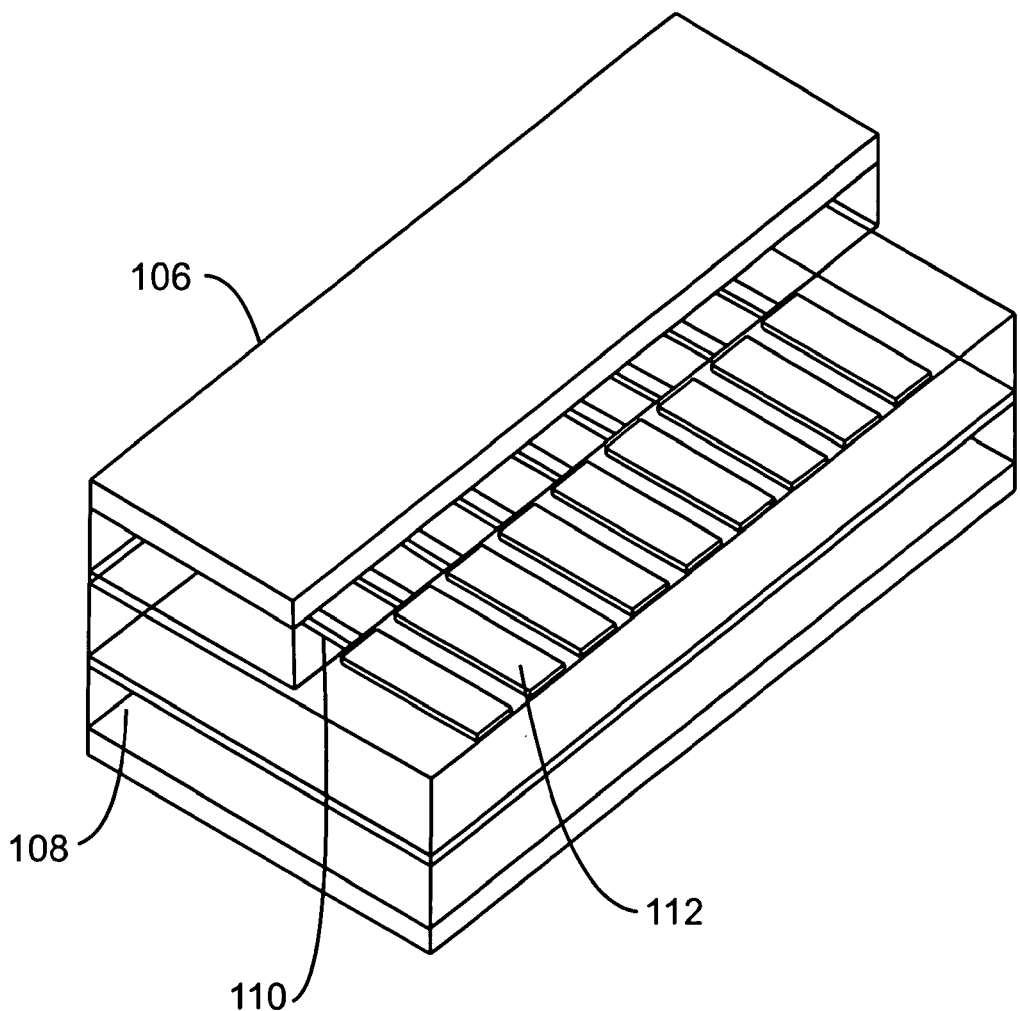
FIGS. 1A-1C are block diagrams of example PCBs for on-cavity board-to-board interconnect.

In one embodiment of the present techniques, board-to-board interconnects may be provided without a connector. Instead, an on-cavity board-to-board interconnect is used. An on-cavity board-to-board interconnect is the connection of two PCBs, where a cavity has been excavated in each PCB to expose solder contact points. The PCBs are then combined, placing the exposed solder of each of the PCBs in electrical contact with each other. Because the electrical contact is made in the space where a cavity has been created, these are called on-cavity board-to-board interconnects. In this way, PCBs may be interconnected without the added z-height of a connector, which is advantageous for incorporating interconnected PCBs into small form factor devices and System in Package devices. The z-height refers to the vertical height of layers of PCBs. Typically, the connector sits on top of the PCBs, thus increasing the z-height, which increases the minimum height of what are designed to be small, in some cases, wearable devices.

In the following description, numerous specific details are set forth, such as examples of specific types of processors and system configurations, specific hardware structures, specific architectural and micro architectural details, specific register configurations, specific instruction types, specific system components, specific measurements or heights, specific processor pipeline stages and operation, etc., in order to provide a thorough understanding of the present invention. It will be apparent, however, to one skilled in the art that these specific details need not be employed to practice the present invention. In other instances, well known components or methods, such as specific and alternative processor architectures, specific logic circuits or code for described algorithms, specific firmware code, specific interconnect operation, specific logic configurations, specific manufacturing techniques and materials, specific compiler implementations, specific expression of algorithms in code, specific power down and gating techniques or logic and other specific operational details of computer system have not been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to smart rings, and may be also used in other devices, such as wearable and handheld devices, systems on a chip (SOC) devices, and embedded applications. Some examples of handheld devices include cellular phones, Internet protocol devices, digital cameras, and handheld PCs. Embedded applications typically include a microcontroller, a digital signal processor (DSP), a system on a chip, network computers (NetPC), or any other system that can perform the functions and operations taught below. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Figure 1B:
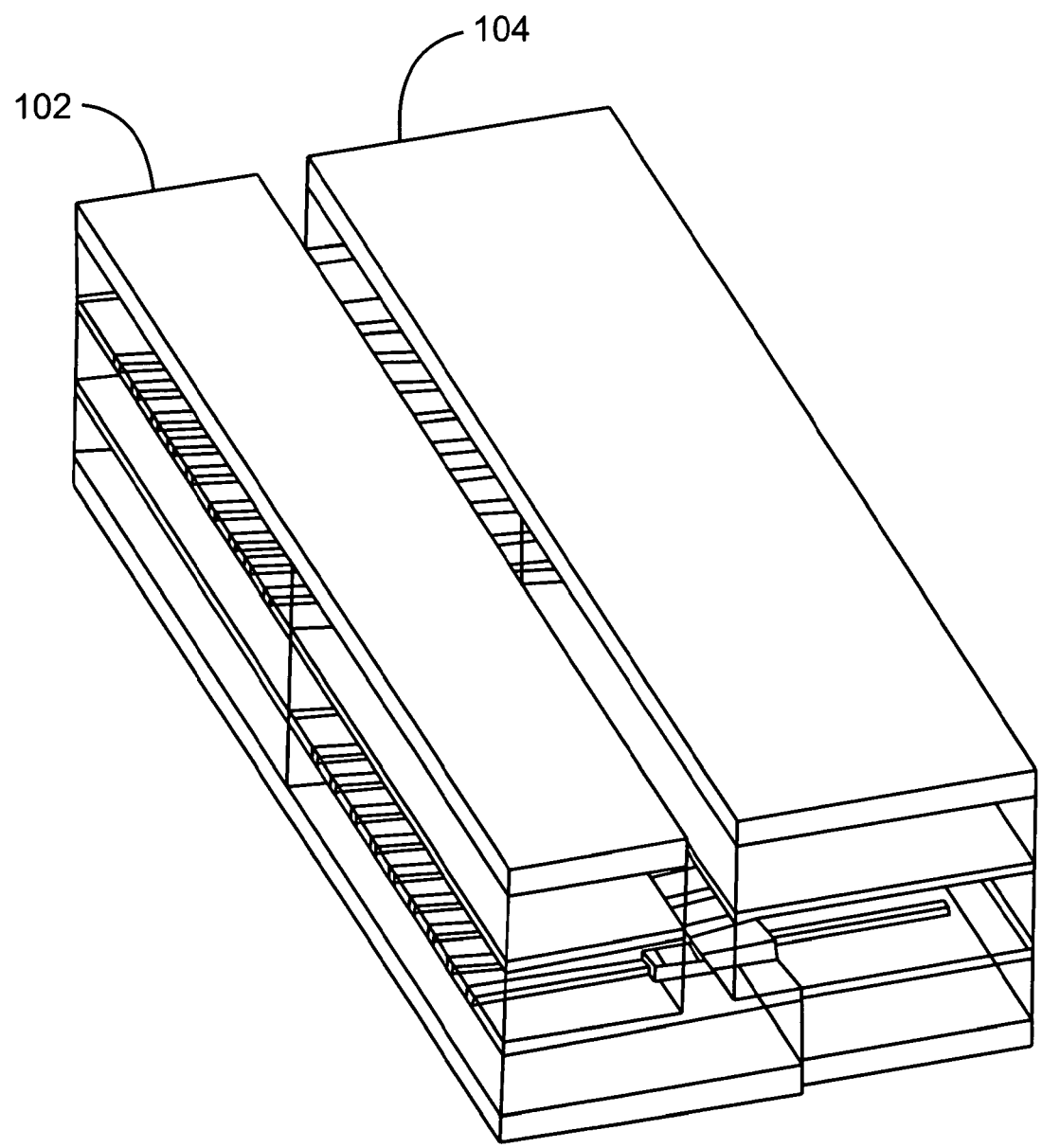
Figure 1C:
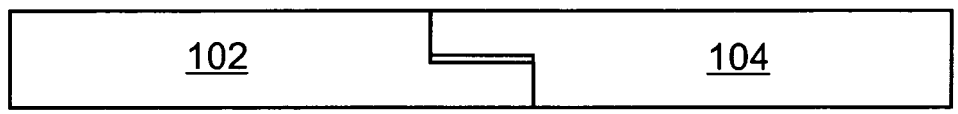

FIGS. 1A-1C are block diagrams of example PCBs 102, 104 for on-cavity board-to-board interconnect. In FIG. 1A, the PCB 102 is shown with a first layer ground 106, dielectric 108, signal traces 110, and exposed solder pads 112. With the use of semi-rigid board recess or other board cavity technology, it is possible to create a recess at the edge of PCB 102 to expose the solder pads 112 as shown. In semi-rigid board recess technology, the PCB is manufactured, with solder pads 112 incorporated within dielectric material. Additionally, the PCB typically includes a first layer ground 106. To create the recess, or cavity, the first metal layer, ground 106, and the first dielectric layers are removed from the edge of the PCB 102, thus exposing the solder pads 112. The physical material, e.g., the metal in the first layer ground 106, and the dielectric material, is cut away mechanically, such as with a high precision router, such as, a laser router. In one embodiment of the present techniques, once the solder pads 112 are exposed by the creation of the cavity, the solder pads 112 may be coated with solder paste to provide a strong solder joint formation. Besides using conventional solder paste for the solder joint, an anisotropic conductive film (ACF) may be used. In some embodiments such as System in Package, some or all of the edges of PCB 102 can be recessed to expose solder pads along multiple edges of PCT 102.

In FIG. 1B, a similar procedure is performed for PCB 104. The PCB 104 is cut as described above. However, the PCB 104 is cut in a complementary way to the PCB 102. In this way, the PCBs 102, 104 can be combined. Thus, with the solder pads of both boards 102, 104 exposed, an interconnect can be created by making electrical contact with the exposed solder pads of both boards 102, 104. In some embodiments, PCT 102 and 104 can be cut in manner which allows PCB 102 and PCB 104 to be mated together. As shown in FIG. 1B the overall height (or Z-dimension) of PCB 102 and 104 when combined can be substantially the same height as when separated.

FIG. 1C is a side view of an on-cavity board-to-board interconnect between PCBs 102 and 104. As shown, the z-height of the PCB 102 and 104, when combined, remains substantially unchanged. In some embodiments, PCB 102 and 104 can be substantially the same height individually and also when combined. By connecting the PCBs in this way, the extra z-height typically taken up by a connector is avoided. In some circumstances layer misregistration may occur during PCB manufacturing. Layer misregistration occurs when a contact mask becomes misaligned. Contact masks are the end point of a signal line or solder pad at the edge of a PCB. To account for the possibility of layer misregistration occurring between the two PCBs 102, 104, the pad size on both PCBs may be enlarged. For small pitch design, a guide pin may be used to overcome the misalignment.

Figure 2A:
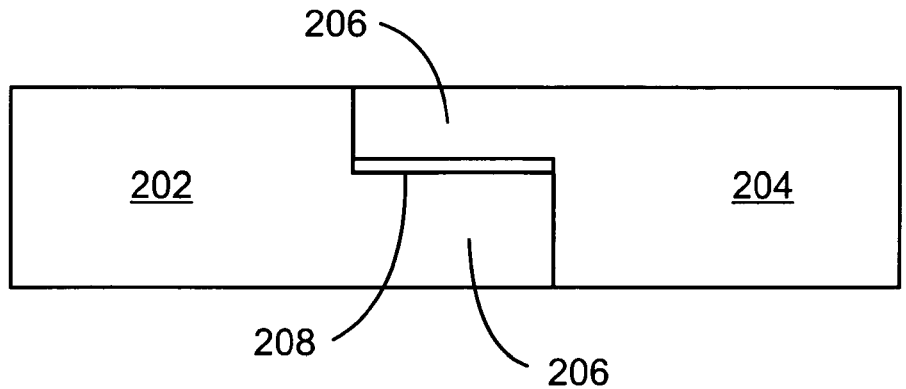
FIGS. 2A-2B are diagrams of example on-cavity interconnected boards in fixed and removable assemblies.
Figure 2B:
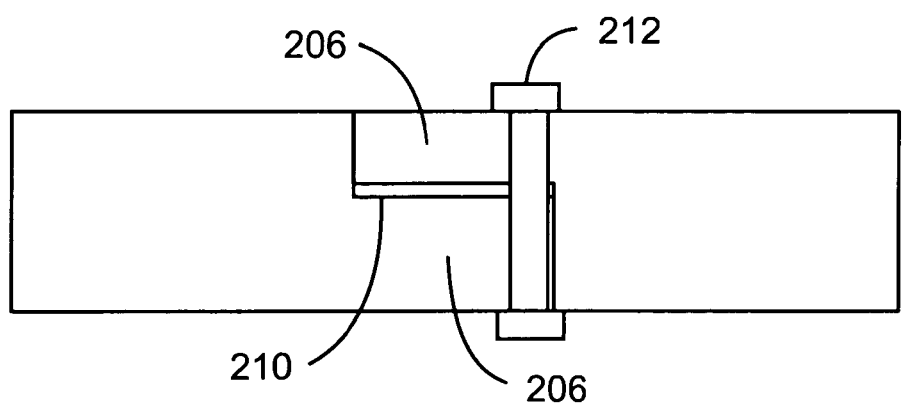

FIGS. 2A-2B are diagrams of example on-cavity interconnected boards 202, 204 in fixed and removable assemblies, respectively. In a fixed assembly, the PCBs 202, 204 may be bonded together by soldering the exposed solder pads 206 together permanently. Alternatively, as shown in FIG. 2A, an adhesive and conductive film 208 is used, such as anisotropic conductive film (ACF) adhesive bonding. Advantageously, the ACF bonding provides quick and easy assembly without stepped or 3D stencilling to apply the solder paste to the pads in the cavity. The film's adhesive properties create a permanent bond between the boards 202, 204 at their exposed solder pads 206. Additionally, the film 208 is conductive, as to provide an electrical contact between the exposed solder pads 206. As shown, the fixed assembly does not increase the z-height.

FIG. 2B is a diagram of a removable assembly. Instead of an adhesive film as used in the fixed assembly, a material 210, such as metallized particle interconnect, or an elastomer, may be placed between the exposed solder pads, to make electrical contact. The metallized particle interconnect is an elastomer with structured metal parts arranged within that provide an electrical contact through the elastomer. In addition to providing electrical contact between the solder pads 206, the metallized particle interconnect provides the flexibility to be able to remove and re-attach the boards without need to raise the external temperature to loosen the bonding. Additionally, a clamping mechanism 212 may be used to physically hold the PCBs 202, 204 together. The clamping mechanism 212 may be a screw, or an external clamping socket. As shown, the removable assembly can slightly increase the z-height due to the height of the ends of clamping mechanism 212. However, the z-height remains substantially the same as the z-height of the combined PCBs 202, 204. In one embodiment of the present techniques, the PCBs 202, 204 include an opening to house a securing mechanism for securing the PCBs 202, 204.

The fixed assembly, provides an advantage over the removable assembly in that the z-height is limited to the combined z-height of the PCBs 202, 204 and the adhesive film. The removable assembly, however, provides the advantage of being able to replace one or both of the combined PCBs. This is advantageous where the computing device incorporating the PCBs is designed to be upgradeable, or scalable.

Advantageously, the on-cavity board-to-board interconnect described herein eliminates the traditional connector from the assembly of interconnected PCBs. This is useful in developing small form factor systems. Additionally, the input-output pin density of the traditional connector is preserved with the on-cavity board-to-board interconnect described herein. The input-output pin density represents the pin map that typically exist on standard connectors. Another advantage is that the on-cavity board-to-board interconnect described herein is electrically better than the traditional connector.

The traditional connector is a lossy interconnect that creates impedance discontinuity. A lossy interconnect is a connector that dissipates some of the electrical energy being passed between electrical contacts. To account for the amount of energy lost to lossy interconnects, a loss budget is built into the design of an electrical system. The loss budget dictates how much electrical energy can be lost, and still provide the designed functionality. However, the improved electrical contact of the on-cavity board-to-board interconnect is not lossy. Accordingly, the loss budget that would have been allocated to traditional connectors can instead be allocated to PCB routing such for additional length or tighter routing density. The loss budget from connector can thus be used to route a longer PCB length.

Additionally, there are fewer impedance discontinuities with the on-cavity board-to-board interconnect than with the traditional connector. Impedance discontinuities are distortions in electrical signals that occur due to some of the signals reflecting backwards instead of towards their destination. On-cavity board-to-board interconnects reduce impedance discontinuities by optimizing the interconnect impedance to match to the system impedance. This can be achieved by tuning the pad, stack-up and reference plane dimensions to yield the required impedance range. Impedance tuning was traditionally hard to tune on a standard connector, due to large physical size.

Another advantage is that the on-cavity board-to-board interconnect reduces crosstalk between adjacent signal lines. By using a direct connection, instead of one that runs through the z-height of the PCBs, there is less potential for cross-talk because of a shorter coupled electrical length and close vicinity to the reference plane. Further, the on-cavity board-to-board interconnect described herein can also be expanded to stacks of PCBs, with multiple layers of on-cavity board-to-board interconnects. With added pin density introduced by multiple layers of on-cavity board-to-board interconnects, we can introduce more gnd pin to provide better crosstalk shielding for noise sensitive signals.

Figure 3:
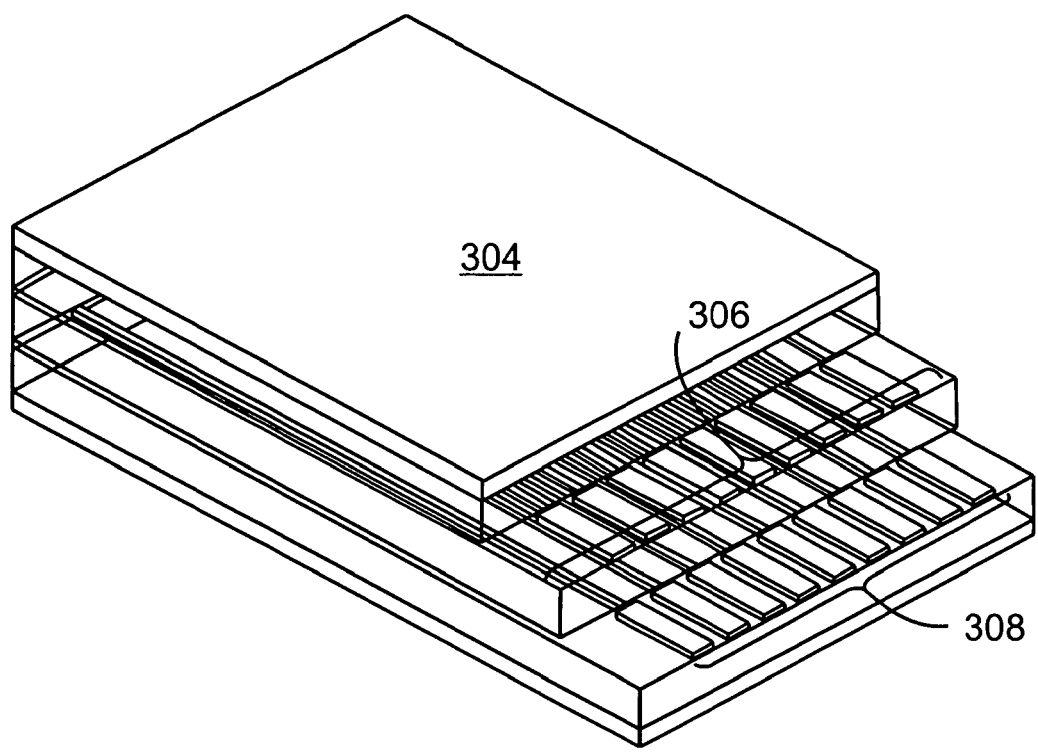
FIG. 3 is a diagram of an example stack of PCBs for on-cavity board-to-board interconnect.

FIG. 3 is a diagram of an example stack 302 of PCBs for on-cavity board-to-board interconnect. The stack 302 includes a ground at the first layer 304, stacked connections of solder pads at the second layer 306, and stacked connections of solder pads at the third layer 308. As shown, two or more layers of solder pads can be exposed for high density input-output. On the second layer, a cavity is created at the edge of the PCB, exposing the solder pads. Similarly, at the third layer, a cavity is cut out of the second layer to expose the solder pads. Both solder pads are designed in larger size to ensure good electrical contact as well as to cater for the potential misalignment between board-to-board. Further, in addition to being expanded vertically, the solder pads can be expanded horizontally.

Figure 4:
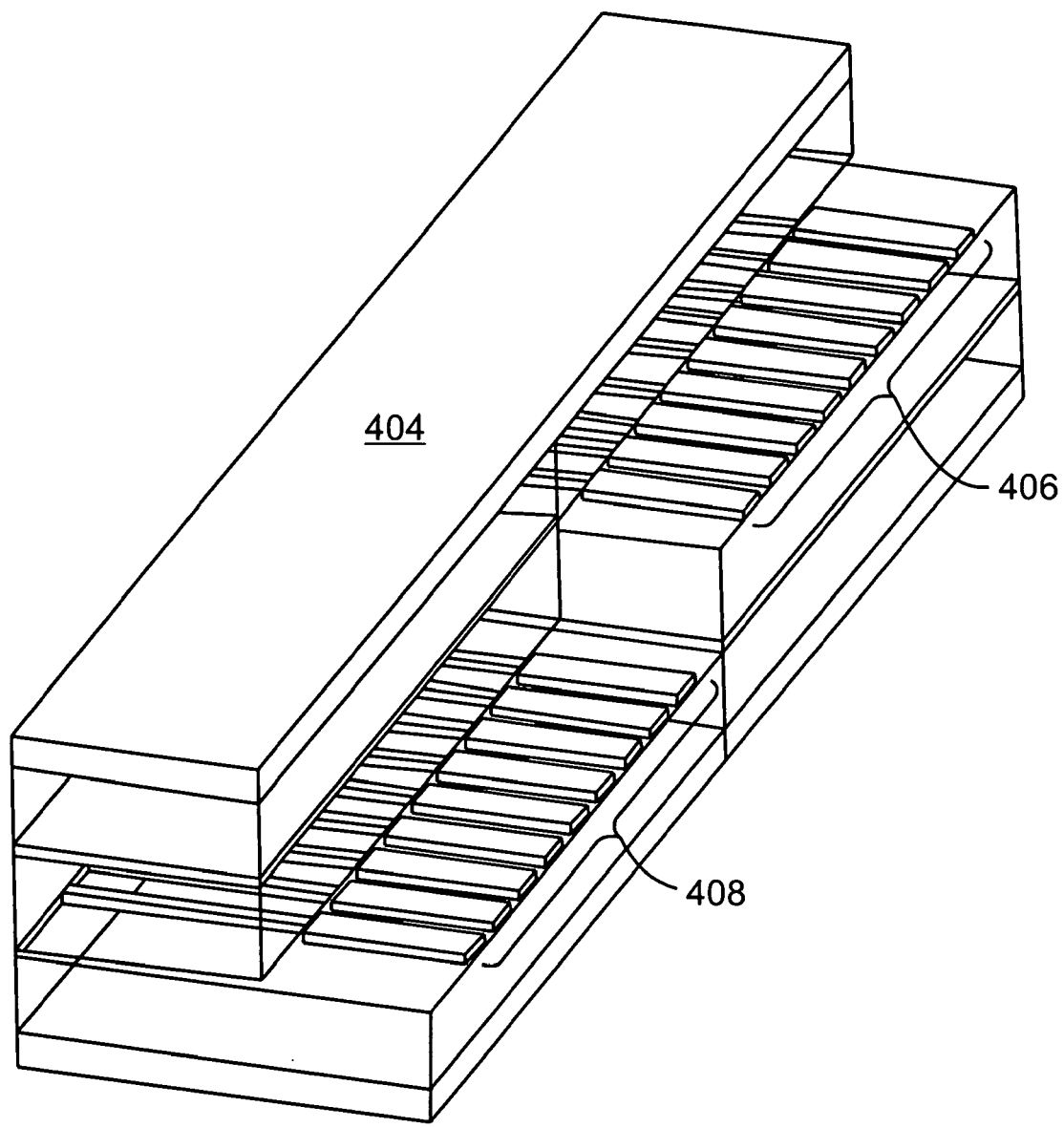
FIG. 4 is a diagram of stacked PCBs for on-cavity board-to-board interconnects with horizontally expanded solder pads.

FIG. 4 is a diagram of stacked PCBs for on-cavity board-to-board interconnects with horizontally expanded solder pads. As shown, the stack 402 includes a ground at the first layer 404, stacked connections at a second layer 406, and stack connections at a third layer 408. As shown, the stacked connections at the second layer 406 and stack connections at the third layer 408 are vertically and horizontally displaced from each other. This displacement creates shielding of the electrical traces with the dielectric material placed in-between. In this way, shielding of the electrical signals is provided that reduces crosstalk input-output between the two groups of stacked connections. Crosstalk is the tendency of electrical traces that are close to each other having their electrical signals migrate into neighboring lines. With the dielectric material between horizontally and vertical displaced connections, the potential for crosstalk is reduced. In one embodiment of the present techniques, such on-cavity board-to-board interconnects are suitable for crosstalk-sensitive input-output. The horizontal displacement can also act as mechanical stopper, and minimize misalignment between boards, especially for removable assemblies.

Figure 5:
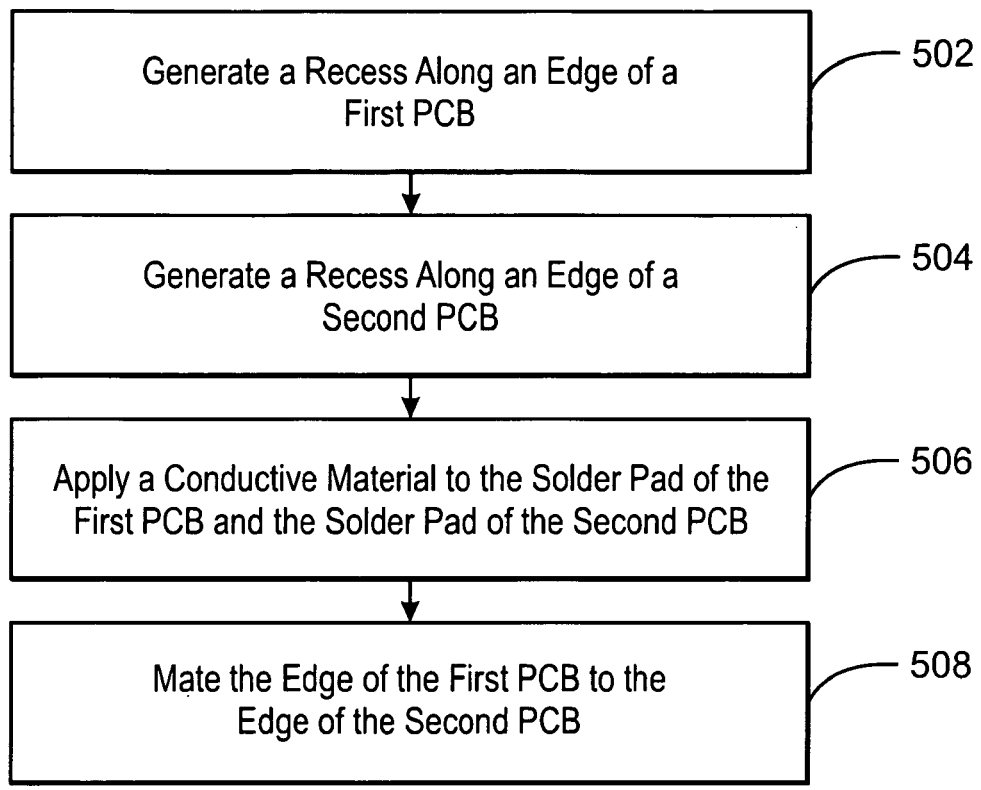
FIG. 5 is a process flow diagram of a method for manufacturing PCBs for on-cavity board-to-board interconnect.

FIG. 5 is a process flow diagram of a method 500 for manufacturing PCBs for on-cavity board-to-board interconnect. The process flow diagram is not intended to represent a sequence of performing the method 500. The method 500 begins at block 502, where a recess is generated along an edge of a first PCB. The first recess exposes a first solder pad on a layer of the first PCB. Generating the recess may be accomplished using a combination of laser and mechanical techniques. Additionally, a laser stop may be used to prevent excavation of the solder material. For a PCB stack, multiple layers of the stack may be removed to expose the solder pads at a specified layer. In one embodiment, the recess may be a notch in a first layer of the first PCB that exposes the solder pad at a second layer of the first PCB.

At block 504, a recess is generated along an edge of a second PCB. The recess along the edge of the second PCB is complementary to the recess along the edge of the first PCB. Additionally, the recess exposes a solder pad on a layer of the second PCB.

At block 506, a conductive material is applied to the solder pad of the first PCB and the solder pad of the second PCB. In the case of a fixed assembly, a solder paste or an anisotropic conductive adhesive may be applied. In the case of a removable assembly, metallized particle interconnect or an elastomer may be applied.

At block 508, the edge of the first PCB is mated to the edge of the second PCB such that the solder pad of the first PCB is electronically coupled to the solder pad of the second PCB via the conductive material. In the case of a fixed assembly, the PCBs are pressed together at the contact points of the corresponding solder pads in either PCB. In the case of a removable assembly, a clamping mechanism is applied, such as shown in FIG. 2B.

Alternatively, a sequential lamination method may be used. In the sequential lamination method, a PCB stack is built up using 2 separate laminates. The PCB stack is built up using the first laminate. The built up PCB stack is cut to the desired layer, and laminated using the second laminate, which provides the solder pads.

Figure 6:
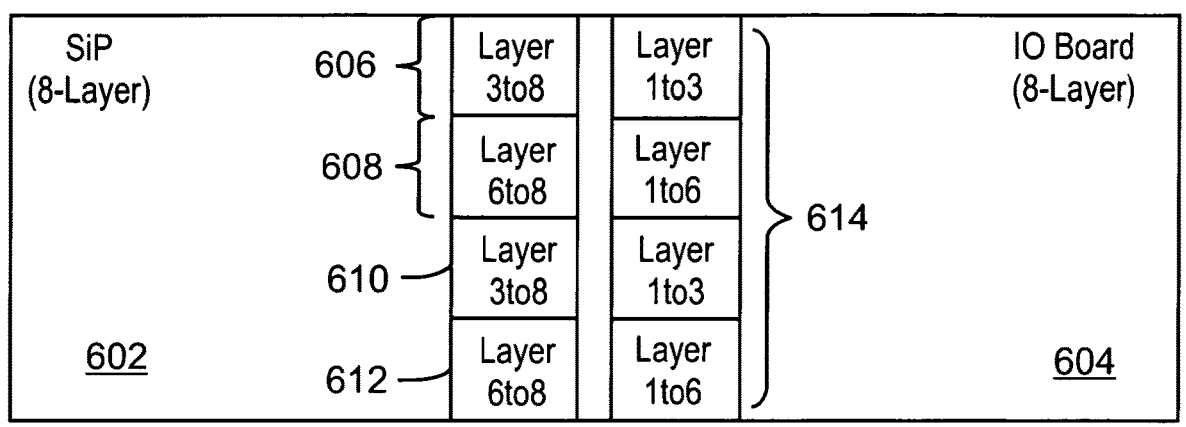
FIG. 6 is a diagram of example sections of System in Package (SIP) and corresponding input-output (IO) board for an on-cavity board-to-board interconnect.

FIG. 6 is a diagram of example sections of System in Package (SIP) 602 and corresponding input-output (IO) board 604 for an on-cavity board-to-board interconnect. The SIP 602 is an 8-layer PCB stack that includes blocks 606, 608, 610, 612. Each block 606, 608, 610, 612 is cut to a different layer of the PCB stack, and corresponds to one of the blocks 614 on the IO board 604. For example, blocks 606, 610 have layers one and two removed, to expose solder pads on layer 3. The corresponding blocks 614 on the IO board 604 have layers 4 through 8 removed, to expose the solder pads at layer 3. Similarly, blocks 608, 612 have layers 1 through 5 removed to expose solder pads at layer 6. The corresponding blocks 614 on the IO board 604 have layers 7 and 8 removed to expose the solder pads at layer 6. Thus, the SIP 602 and IO board 604 can be combined to form on-cavity board-to-board interconnects that can interlock. The blocks 608, 610, 612 can be repeated along the edge of a SIP. As shown, the blocks along an edge of SIP 602 can be configured to have two alternating heights. In other words, a first block along an edge of SIP 602 can have a first height of X while a subsequent block along the same edge of SIP 602 can have a second height of Y, followed by a third block along the same edge having a first height of X. This configuration can allow SIP 602 and IO board 604 to mate or interlock with one another. In other embodiments, the blocks along an edge of SIP 602 can be configured to have different heights which serve to guide SIP 602 into a preferred coupling configuration with IP board 604.

Figure 7:
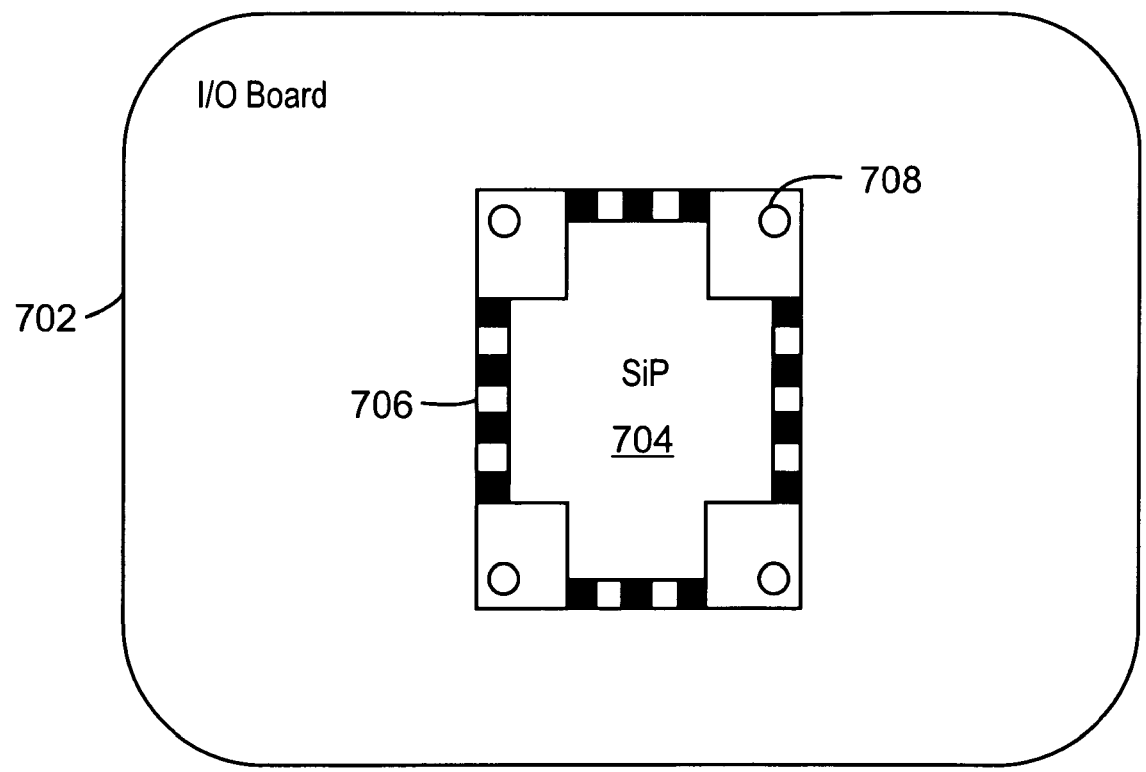
FIG. 7 is a diagram of an example on-cavity board-to-board interconnect between a System in Package and an IO board.

FIG. 7 is a diagram of an example on-cavity board-to-board interconnect 706 between a System in Package 704 and an IO board 702. The on-cavity board-to-board interconnect 706 represents the edges of the SIP 704 and IO board 702, i.e., blocks 606, 608, 610, 612, 614 described with reference to FIG. 6. Referring back to FIG. 7, in this way, SIP 704 may be placed within a cavity of IO board 702 so that the four edges of SIP 704 (i.e., the boundary of SIP 704) mates with a cavity of IO board 702. In one example, the z-height of the combined system is substantially the same as the z-height of the IO board 702. Furthermore, on-cavity board-to-board interconnect provides an increased IO density over traditional techniques. Screws 708 may be used to secure the SIP 704 and the IO board 702 together. Advantageously, using a removable assembly like screws 708, allows for the use of multiple, replaceable SIPs 704. Alternatively, the SIP 704 and IO board 702 may be soldered down, or combined using an anisotropic conductive adhesive.

EXAMPLES

Example 1 is a system. The system includes a first printed circuit board (PCB) having a first recess along a first edge of the first PCB that exposes a first solder pad on a layer of the first PCB; a second PCB having a second recess along a second edge of the second PCB that exposes a second solder pad on a layer of the second PCB, the second recess being complementary to the first recess to allow the first PCB to mate with the second PCB, wherein the first solder pad is aligned with the second solder pad when the first PCB is mated with the second PCB; and an assembly configured to electronically couple the first solder pad with the second solder pad.

Example 2 includes the system of example 1, including or excluding optional features. In this example, the first PCB is a system in package (SIP) and the second PCB is an IO board. Optionally, the IO board includes a cavity to house the first PCB.

Example 3 includes the system of any one of examples 1 to 2, including or excluding optional features. In this example, a z-height of the first PCB is substantially the same as the z-height of the system.

Example 4 includes the system of any one of examples 1 to 3, including or excluding optional features. In this example, the assembly includes a conductive material comprising an anisotropic conductive adhesive.

Example 5 includes the system of any one of examples 1 to 3, including or excluding optional features. In this example, the assembly includes a conductive material to apply to the first solder pad and the second solder pad and a removable clamping mechanism.

Example 6 includes the system of example 5, including or excluding optional features. In this example, the first recess exposes at least two layers of the first PCB. Optionally, the first recess includes a plurality of alternating blocks, wherein a first set of blocks expose solder pads on a first layer of the first PCB and a second set of blocks expose solder pads on a second layer of the first PCB.

Example 7 is a method for interconnecting two PCBs. The method includes generating a first recess along a first edge of a first PCB, the first recess exposing a first solder pad on a layer of the first PCB; generating a second recess along a second edge of a second PCB, the second recess being complementary to the first recess and having a second solder pad on the layer of the second PCB; applying a conductive material to the first solder pad and the second solder pad; and mating the first edge of the first PCB to the second edge of the second PCB such that the first solder pad is electronically coupled to the second solder pad via the conductive material.

Example 8 includes the method of example 7, including or excluding optional features. In this example, the first PCB is a SIP and the second PCB is an IO board. Optionally, the IO board includes a cavity to house the SIP.

Example 9 includes the method of any one of examples 7 to 8, including or excluding optional features. In this example, generating the first recess comprises generating a first plurality of alternating blocks, wherein the first set of blocks expose solder pads on a first layer of the first PCB and a second set of blocks expose solder pads on a second layer of the first PCB. Optionally, generating the second recess comprises generating a second plurality of alternating blocks that are complementary to the first plurality of alternating blocks.

Example 10 includes the method of any one of examples 7 to 9, including or excluding optional features. In this example, mating the first edge of the first PCB to the second edge of the second PCB comprises applying a removable clamping mechanism to clamp the first PCB to the second PCB.

Example 11 is an apparatus. The apparatus includes a printed circuit board (PCB) including: a first layer to ground the PCB and a second layer below the first layer having a first plurality of solder pads exposed along an edge of the PCB; and an arrangement of conductive material to cover the first plurality of solder pads.

Example 12 includes the apparatus of example 11, including or excluding optional features. In this example, the conductive material includes an anisotropic conductive adhesive to fix the PCB to another PCB.

Example 13 includes the apparatus of any one of examples 11 to 12, including or excluding optional features. In this example, the PCB further includes an opening to house a securing mechanism for securing the PCB to another PCB.

Example 14 includes the apparatus of any one of examples 11 to 13, including or excluding optional features. In this example, the PCB further includes: a notch within the first layer to expose the at least one solder pad of the second layer.

Example 15 includes the apparatus of any one of examples 11 to 14, including or excluding optional features. In this example, the PCB further includes: a third layer below the second layer having a second plurality of solder pads.

Example 16 includes the apparatus of any one of examples 11 to 15, including or excluding optional features. In this example, the second plurality of solder pads are exposed along the edge of the PCB.

Example 17 includes the apparatus of any one of examples 11 to 16, including or excluding optional features. In this example, the second plurality of solder pads are exposed parallel to the first plurality of solder pads.

Example 18 is a method. The method includes generating a first notch through a first set of layers of a printed circuit board (PCB) to form a first recess exposing a first plurality of solder pads along a first edge of the PCB; and applying a conductive material to the first plurality of solder pads, the conductive material being configured to electronically couple the PCB to another PCB.

Example 19 includes the method of example 18, including or excluding optional features. In this example, the method includes generating a second notch through a second set of layers of the PCB to form a second recess exposing a second plurality of solder pads, the second set of layers being different than the first set. Optionally, the second plurality of solder pads are exposed along the first edge of the PCB.

Example 20 includes the method of any one of examples 18 to 19, including or excluding optional features. In this example, the second plurality of solder pads are parallel to the first plurality of solder pads.

Example 21 includes the method of any one of examples 18 to 20, including or excluding optional features. In this example, the method includes generating an opening in the PCB to house a securing mechanism to secure the PCB to the another PCB.

Example 22 is a system for interconnecting two PCBs. The system includes means to generate a first recess along a first edge of a first PCB, the first recess exposing a first solder pad on a layer of the first PCB; means to generate a second recess along a second edge of a second PCB, the second recess being complementary to the first recess and having a second solder pad on the layer of the second PCB; means to apply a conductive material to the first solder pad and the second solder pad; and means to mate the first edge of the first PCB to the second edge of the second PCB such that the first solder pad is electronically coupled to the second solder pad via the conductive material.

Example 23 includes the system of example 22, including or excluding optional features. In this example, the first PCB is a SIP and the second PCB is an IO board. Optionally, the IO board includes a cavity to house the SIP.

Example 24 includes the system of any one of examples 22 to 23, including or excluding optional features. In this example, the means to generate the first recess comprises means to generate a first plurality of alternating blocks, wherein the first set of blocks expose solder pads on a first layer of the first PCB and a second set of blocks expose solder pads on a second layer of the first PCB. Optionally, the means to generate the second recess comprises means to generate a second plurality of alternating blocks that are complementary to the first plurality of alternating blocks.

Example 25 includes the system of any one of examples 22 to 24, including or excluding optional features. In this example, the means to mate the first edge of the first PCB to the second edge of the second PCB comprises means to apply a removable clamping mechanism to clamp the first PCB to the second PCB.

Not all components, features, structures, characteristics, etc., described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A system, comprising:
   a first printed circuit board (PCB) having a first recess along a first edge of the first PCB, wherein the first recess includes a first solder pad exposed on a first layer of the first PCB and a second solder pad exposed on a second layer of the first PCB; wherein the first solder pad and the second solder pad being vertically and horizontally displaced from one another;
   a second PCB having a second recess along a second edge of the second PCB, wherein the second recess is complementary to the first recess, and the second recess includes a third solder pad exposed on a third layer of the second PCB, and a fourth solder pad exposed on a fourth layer of the second PCB; wherein the third solder pad and the fourth solder pad being vertically and horizontally displaced from one another; and
   a removable clamp to couple together the first PCB to the second PCB;
   wherein:
      the first solder pad is electrically coupled to the third solder pad on the third layer of the second PCB by at least a metallized particle interconnect, with the first solder pad aligned with the third solder pad on the third layer of the second PCB;
      the second solder pad is electrically coupled to the fourth solder pad on the fourth layer of the second PCB by at least a metallized particle interconnect, with the second solder pad aligned with the fourth solder pad on the fourth layer of the second PCB; and
      a z-height of the first PCB, a z-height of the second PCB and a z-height of the first PCB and the second PCB when coupled together are substantially equal.

2. The system of claim 1, wherein the first PCB is a system in package (SIP) and the second PCB is an IO board.

3. The system of claim 2, wherein the IO board includes a cavity to house the first PCB.

4. The system of claim 1, wherein the metallized particle interconnect includes a conductive material comprising an elastomer.

* * * * *